United States Patent
Loo et al.

(10) Patent No.: US 7,816,182 B2
(45) Date of Patent: Oct. 19, 2010

(54) SIMPLIFIED MULTICHIP PACKAGING AND PACKAGE DESIGN

(75) Inventors: Kum-Weng Loo, Singapore (SG); Chek-Lim Kho, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 11/000,355

(22) Filed: Nov. 30, 2004

(65) Prior Publication Data

US 2006/0113643 A1    Jun. 1, 2006

(51) Int. Cl.
*H01L 21/50* (2006.01)

(52) U.S. Cl. .................. 438/109; 438/106; 438/108; 438/111; 438/113; 438/114; 438/107; 438/110; 438/112; 438/118; 257/666; 257/E23.052

(58) Field of Classification Search .............. 438/106, 438/108, 111, 113, 114, 109, 107, 110, 112, 438/118; 257/666, E23.052
See application file for complete search history.

(56) References Cited

U.S. PATENT DOCUMENTS

| | | |
|---|---|---|
| 5,366,933 A | 11/1994 | Golwalkar et al. |
| 5,527,740 A | 6/1996 | Golwalkar et al. |
| 5,545,922 A | 8/1996 | Golwalkar et al. |
| 5,719,436 A | 2/1998 | Kuhn |
| 5,793,101 A | 8/1998 | Kuhn |
| 5,870,289 A | 2/1999 | Tokuda et al. |
| 6,087,722 A * | 7/2000 | Lee et al. ................ 257/723 |
| 6,316,727 B1 | 11/2001 | Liu |
| 6,552,418 B2 * | 4/2003 | Misumi et al. ............ 257/666 |
| 6,559,526 B2 * | 5/2003 | Lee et al. ................ 257/676 |
| 6,700,206 B2 * | 3/2004 | Kinsman ................. 257/777 |
| 6,943,061 B1 * | 9/2005 | Sirinorakul et al. ........ 438/113 |
| 6,955,941 B2 * | 10/2005 | Bolken .................... 438/106 |
| 7,101,620 B1 * | 9/2006 | Poddar et al. ............. 428/354 |
| 2002/0121680 A1 | 9/2002 | Ahn et al. |
| 2003/0020177 A1 | 1/2003 | Oka |
| 2003/0022465 A1 * | 1/2003 | Wachtler ................. 438/462 |
| 2003/0162325 A1 * | 8/2003 | Tan et al. ................ 438/109 |
| 2004/0021234 A1 * | 2/2004 | Shibata ................... 257/791 |

FOREIGN PATENT DOCUMENTS

| | | |
|---|---|---|
| JP | 61-116846 | 6/1986 |
| JP | 5-109975 | 4/1993 |
| JP | 11-111758 | 4/1999 |
| JP | 11-163253 | 6/1999 |

OTHER PUBLICATIONS

European Search Report dated Aug. 18, 2009 in connection with European Patent No. EP 05 25 7300.

* cited by examiner

*Primary Examiner*—Lynne A Gurley
*Assistant Examiner*—Junghwa M Im
(74) *Attorney, Agent, or Firm*—Lisa K. Jorgenson; William A. Munck

(57) ABSTRACT

A multichip integrated circuit apparatus includes first and second integrated circuit die mounted on opposite sides of a leadframe die paddle, with at least one of the integrated circuit die extending further toward the leads than does the die paddle. With this arrangement, the active circuit areas of both integrated circuit die can face in the same direction, and can be wire bonded to the same surfaces of the leads. This avoids wire bonding complications that are often encountered in multichip integrated circuit package designs.

20 Claims, 4 Drawing Sheets

US 7,816,182 B2

SIMPLIFIED MULTICHIP PACKAGING AND PACKAGE DESIGN

FIELD OF THE INVENTION

This invention relates generally to integrated circuit packaging and, more particularly, to multichip packaging.

BACKGROUND OF THE INVENTION

A continuing goal of the semiconductor industry is to maximize circuit density. One conventional approach is to provide more than one semiconductor die (or chip) in a single integrated circuit package. To this end, in various conventional designs, first and second integrated circuit die are mounted on opposite sides of a leadframe die paddle. In some of these designs, the leadframe must be flipped in order to make all necessary wire bonding connections, and wires are bonded to both the upper and lower surfaces of the leads. Bonding to both lead surfaces requires plating both lead surfaces (e.g. with silver). In some designs, the die paddle must be specially designed to provide adequate heat transfer during wire bonding. Some designs require a special interconnect circuit which wraps around from one side of the die paddle to the other side of the die paddle. Bond pads of the integrated circuit die on one side of the die paddle are connected to the interconnect circuit in order to render that integrated circuit die electrically accessible from the other side of the die paddle.

It can be seen from the foregoing discussion that the conventional technique of mounting integrated circuit die on opposite sides of a leadframe die paddle adds complications to the design and production process.

FIG. 1 illustrates another conventional technique of providing more than one integrated circuit die in a single integrated circuit package. In FIG. 1, a spacer/interposer (such as a semiconductor substrate) is interposed between first and second integrated circuit die, one of which is mounted on the die paddle 11. The upper, active circuit areas of both integrated circuit die are wire bonded to the sets of leads 12 and 13. The existence of the spacer/interposer causes the arrangement of FIG. 1 to occupy more space than do the aforementioned arrangements wherein the integrated circuit die are mounted on opposite sides of the die paddle. Also, the arrangement of FIG. 1 introduces a mismatch in the coefficient of thermal expansion (CTE). Accordingly, the downset of the die paddle 11 with respect to the lead sets 12 and 13 is typically provided to compensate for this CTE mismatch.

It is desirable in view of the foregoing to provide for multichip packaging designs which can overcome the aforementioned disadvantages associated with various conventional approaches.

SUMMARY OF THE INVENTION

Exemplary embodiments of the invention provide an integrated circuit apparatus having first and second integrated circuit die mounted on opposite sides of a leadframe die paddle, with at least one of the integrated circuit die extending further toward the leads than does the die paddle. This arrangement permits the active circuit areas of both integrated circuit die to face in the same direction, and to be wire bonded to the same surfaces of the leads. This simplifies the wire bonding process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form. (STMI)

Before undertaking the Detailed Description of the Invention below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

The figures and the various embodiments used to describe the principles of the present invention in this patent document are by way of illustration only and should not be construed in any way to limit the scope of the invention.

Exemplary embodiments of the invention provide for mounting first and second integrated circuit die on opposite sides of a leadframe die paddle. At least one of the integrated circuit die extends further toward both sets of leadframe leads than does the die paddle, thereby permitting the active circuit areas of both integrated circuit die to face in the same direction and to be wire bonded to the same surfaces of the leadframe leads. The wire bonding process does not require flipping the leadframe, and no special die paddle design is needed for heat transfer during wire bonding.

Figure 2:
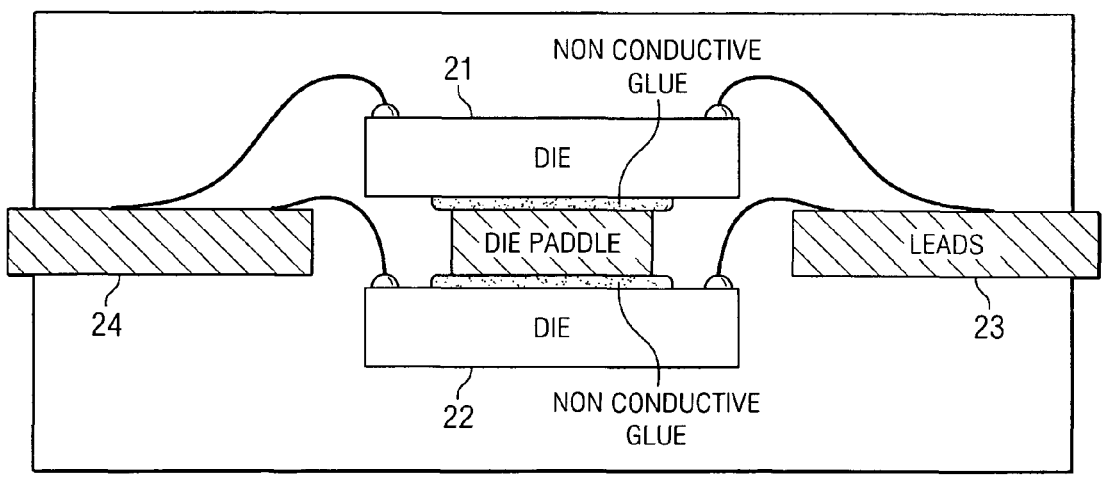
FIG. 2 illustrates a multichip package design according to exemplary embodiments of the invention.

FIG. 2 illustrates a multichip package design according to exemplary embodiments of the invention. In the example of FIG. 2, integrated circuit die 21 and 22 are mounted on opposite sides of a leadframe die paddle using any suitable die adhesive, for example a non-conductive glue. The active circuit area of the integrated circuit die 22 faces the die paddle, and the active circuit area of the integrated circuit die 21 faces oppositely from the die paddle, so both active circuit areas are facing in the same direction. The integrated circuit die 22 extends further toward both sets of leads 23 and 24 than does the die paddle, thereby permitting the integrated circuit die 22 to be wire bonded to the same surfaces of the leads 23 and 24 as is the integrated circuit die 21. By wire bonding to the same side of the leads 23 and 24, only that side of the leads need be plated (such as silver plating). Also, both integrated circuit die can be wire bonded to the leads without requiring any flipping of the lead frame during the wire bonding process.

Figure 3:
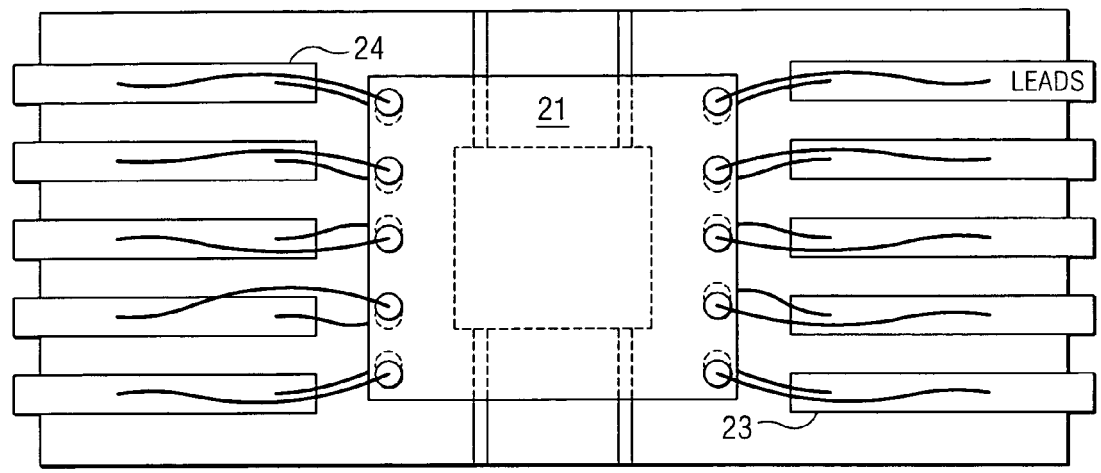
FIG. 3 is a top view of FIG. 2.

FIG. 3 provides a top view of the multichip package design of FIG. 2.

Figure 1:
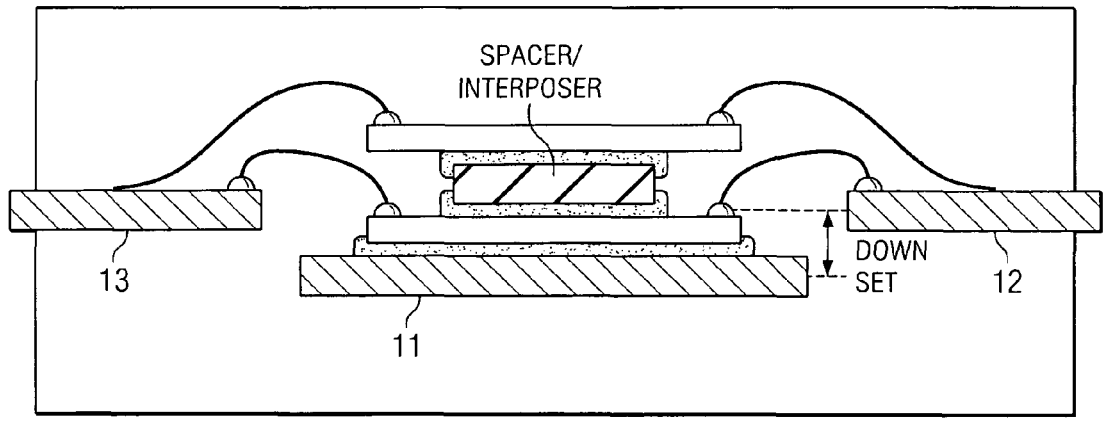
FIG. 1 illustrates a conventional multichip package design.
Figure 4:
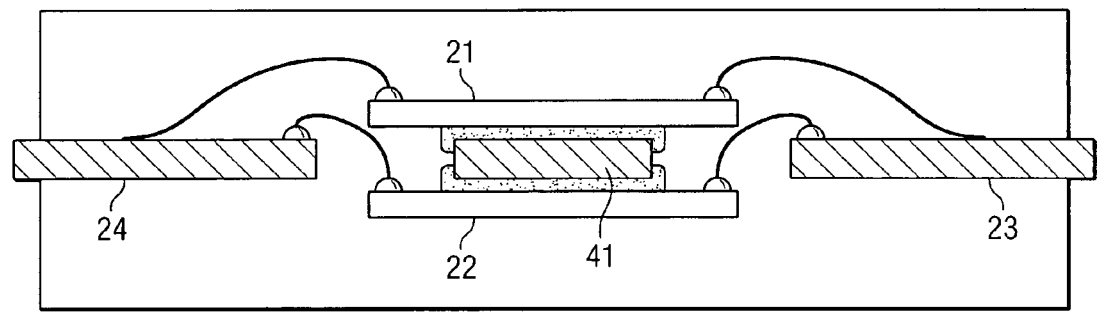
FIG. 4 illustrates a specific embodiment of the multichip package design of FIG. 2.

FIG. 4 illustrates a specific example of the multichip package design of FIG. 2, with exemplary physical dimensions labeled therein. As shown more clearly in the example of FIG. 4, because no interposer/spacer is utilized, the embodiments of FIGS. 2-4 do not introduce a CTE mismatch problem, so a downset such as illustrated in prior art FIG. 1 is not necessary.

Figure 5:
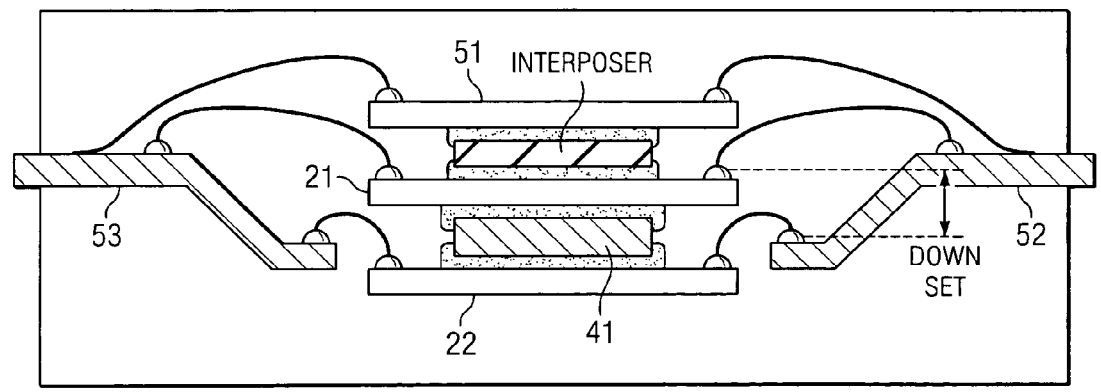
FIG. 5 illustrates a multichip packaging design according to exemplary embodiments of the invention, and including a spacer/interposer.

FIG. 5 illustrates a further multichip package design according to exemplary embodiments of the invention. FIG. 5 is generally similar to the embodiments of FIGS. 2-4, with two integrated circuit die 21 and 22 mounted on opposite sides of a leadframe die paddle 41 and facing in a common direction. An interposer is mounted on the active surface area of the integrated circuit die 21, and a third integrated circuit die 51 is mounted on the interposer, with its active circuit area facing away from the interposer. The arrangement of FIG. 5 thus implements a stack of three integrated circuit die whose respective active circuit areas face in a common direction. The stacking of the interposer and third integrated circuit die 51 on the integrated circuit die 21 can be accomplished in generally the same conventional fashion as the interposer and second integrated circuit die are stacked onto the first integrated circuit die in prior art FIG. 1.

The leads at 52 and 53 in FIG. 5 are shaped differently than the leads in the embodiments of FIGS. 2-4, in order to better accommodate wire bonding to the three integrated circuit die 21, 22 and 51. In particular, the outer portions of the leads at 52 and 53 extend generally inwardly toward the middle integrated circuit die 21 and are approximately coplanar therewith. However, the inner portions of the leads at 52 and 53 are angled in a direction toward the integrated circuit die 22, thereby facilitating wire bonding to the integrated circuit die 22. In the example of FIG. 5, the active circuit die areas of all three integrated circuit die are wire bonded to the same side of the leads at 52 and 53. The dimensions illustrated in FIG. 5 are provided by way of example only, in order to describe one specific embodiment represented by FIG. 5.

Figure 6:
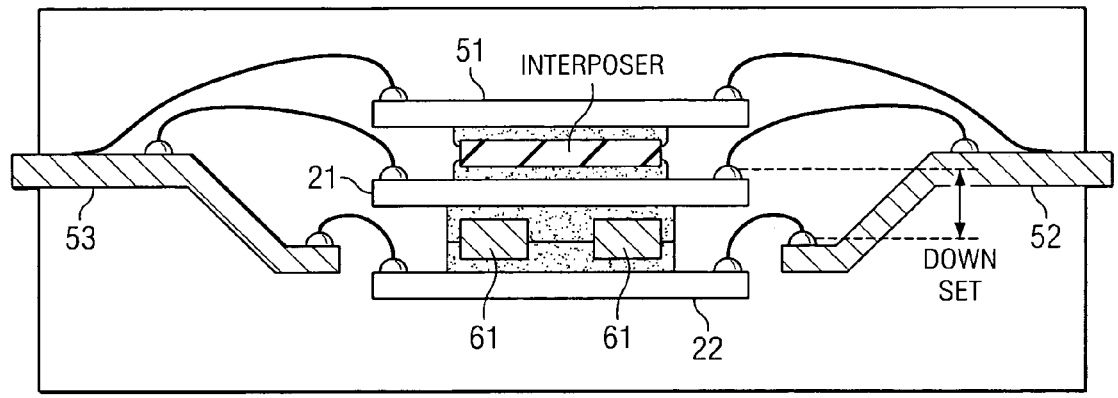
FIG. 6 is similar to FIG. 5, but utilizes a split die paddle according to exemplary embodiments of the invention.

FIG. 6 illustrates a multichip package design according to further exemplary embodiments of the invention. The example of FIG. 6 is similar to FIG. 5, but utilizes a two-piece or split die paddle 61, rather than a one-piece die paddle 41 as shown in FIG. 5. The space between the two pieces of the die paddle 61 is filled in with the glue that is used to mount the integrated circuit die 21 and 22 on the die paddle 61. As in the examples of FIGS. 2-5, the integrated circuit die 21 and 22 mounted on the split die paddle 61 extend further toward both sets of leads 52 and 53 than does the split die paddle 61, thereby providing space for wire bonding the integrated circuit die 22 onto the same surface of the leads 52 and 53 as are the other two integrated circuit die 21 and 51. This also permits the entire wire bonding process to be completed without flipping the leadframe. The specific dimensions shown in FIG. 6 are provided by way of example only, in order to describe one particular embodiment represented by FIG. 6.

Figure 7:
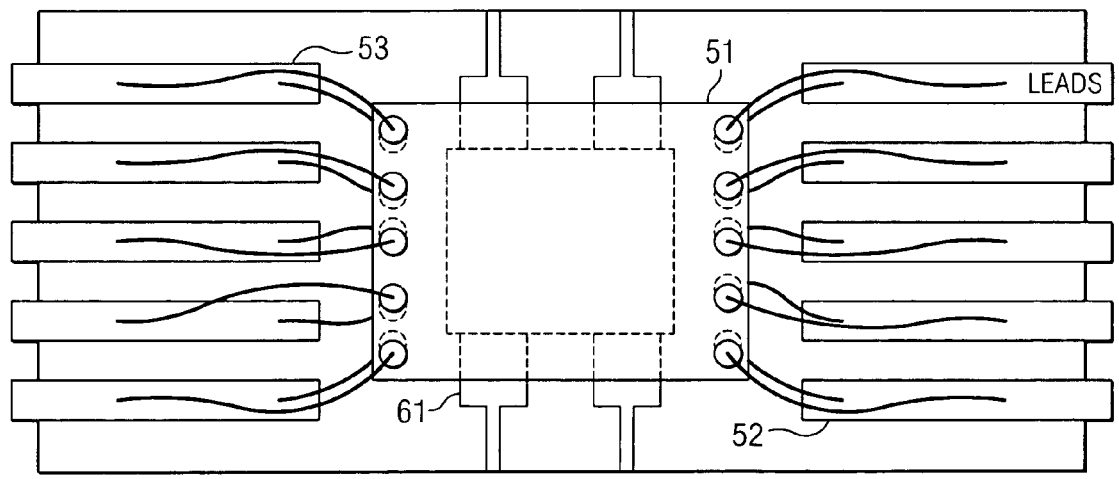
FIG. 7 is a top view of FIG. 6.

FIG. 7 is a top view of the multichip package design of FIG. 6.

In all of the embodiments illustrated in FIGS. 2-7, the back of the integrated circuit die 22 can be used for heat transfer purposes during the wire bonding process, so there is no need for the aforementioned special die paddle design that some prior art approaches use to effectuate heat transfer during the wire bonding process.

Figure 8:
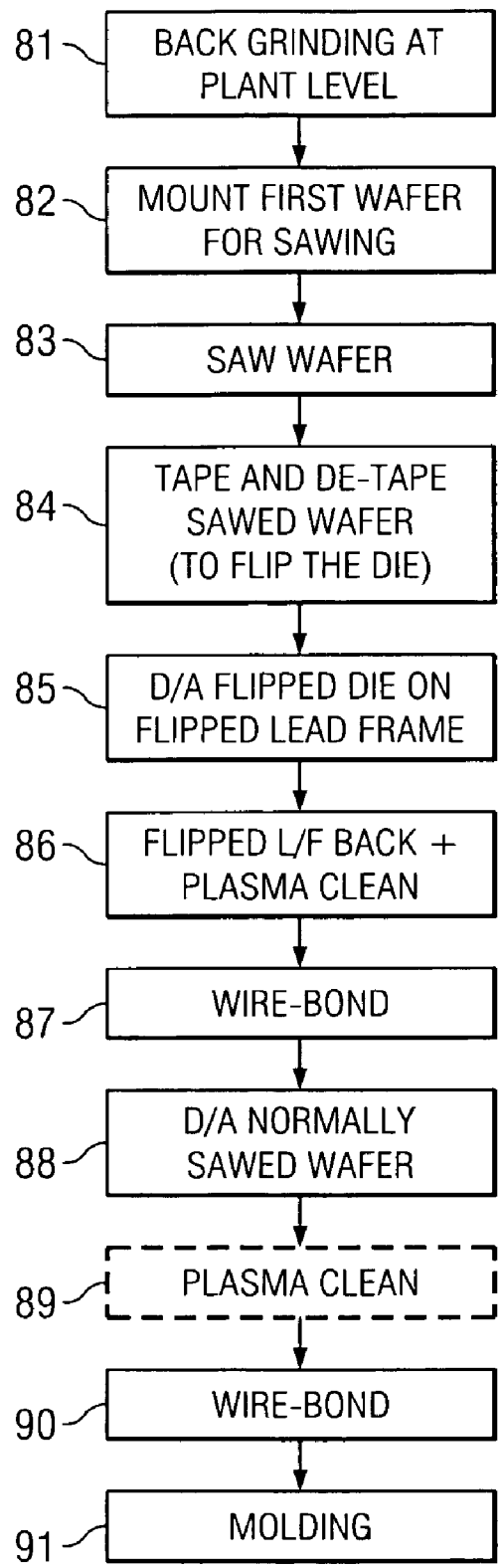
FIG. 8 illustrates an exemplary process for use in producing the embodiments of FIGS. 2-7.

FIG. 8 illustrates exemplary operations which can be performed to produce the exemplary multichip package design described above with respect to FIGS. 2-4. After backgrinding the wafer at 81, the wafer is mounted (and backside taped) for sawing at 82, and is then sawed at 83. At 84, the sawed wafer is taped again, this time on the active surface side of the wafer, and the backside of the wafer is de-taped. With the tape now on the active circuit side of the wafer, the wafer has been effectively flipped for purposes of the packaging process. Therefore, with the leadframe flipped also, the flipped die can be die-attached (D/A) to the flipped leadframe at 85, which results in the active circuit area of the die mounted on and facing what will ultimately be the bottom of the die paddle (see also die 22 of FIGS. 2-4). At 86, the leadframe is flipped back over and a plasma cleaning process can be performed. Thereafter, at 87, the integrated circuit die (for example 22 in FIGS. 2-4) is wire bonded to the appropriate leads. Then, at 88, a die from a further, normally sawed wafer, with tape on its backside, is die attached to the leadframe die paddle (which was flipped back over at 86). This die corresponds to die 21 of FIGS. 2-4. After another plasma cleaning operation at 89, the integrated circuit die that was mounted at 88 (e.g. die 21 of FIGS. 2-4) is wired bonded to the appropriate leads at 90. Thereafter, the leadframe and integrated circuit die are encapsulated within a molding compound at 91.

Referring now to FIG. 8 and FIG. 5, the arrangement of FIG. 5 can be produced by using the operations up through operation 90 of FIG. 8, and thereafter mounting the interposer and third integrated circuit die 51 onto the integrated circuit die 21 using generally the same conventional techniques utilized to mount the interposer and second integrated circuit die of prior art FIG. 1. Thereafter, the third integrated circuit die 51 of FIG. 5 is wire bonded to the leads 52 and 53, after which the entire arrangement is encapsulated in a molding compound.

The structure of FIG. 6 differs from the structure of FIG. 5 in its use of a split die paddle 61, and it will therefore be apparent to workers in the art that the arrangement of FIG. 6 can be readily produced in generally the same fashion as described above with respect to FIG. 5.

Although the present invention has been described in detail, those skilled in the art will understand that various changes, substitutions, and alterations herein may be made without departing from the spirit and scope of the invention it its broadest form.

What is claimed is:

1. A method of mounting first and second integrated circuit die on first and second generally oppositely facing sides of a leadframe die paddle, comprising:

taping an active circuit area of the first integrated circuit die;

attaching the taped region of the first integrated circuit die to the first side of the die paddle;

electrically connecting contacts on the first integrated circuit die to first portions of each of a plurality of leads, wherein each of the first lead portions is offset from a plane including second lead portions of the respective leads;

performing a first plasma cleaning process on the first integrated circuit die after the first integrated circuit die is attached to the first side of the die paddle but before the second integrated circuit die is mounted on the second side of the die paddle;

taping a backside of the second integrated circuit die;

attaching the taped region of the second integrated circuit die to the second side of the die paddle;

electrically connecting contacts on the second integrated circuit die to the second portions of each of the plurality of leads; and performing a second plasma cleaning process on the second integrated circuit die after the second integrated circuit die is attached to the second side of the die paddle but before electrically connecting the contacts on the second integrated circuit die to the second lead portions.

2. The method of claim 1, including flipping the die paddle after one of the attaching steps and before the other of the attaching steps.

3. The method of claim 1, including taping the active circuit area side of the first integrated circuit die before taping the backside of the second integrated circuit die.

4. The method of claim 1, wherein a leadframe including the leadframe die paddle includes a first set of the leads and a second set of the leads disposed on either side of the die paddle, and one of the first and second integrated circuit die extends further toward both of the first and second sets of leads than does the die paddle.

5. The method of claim 4, wherein the other of the first and second integrated circuit die extends further toward both of the first and second sets of leads than does the die paddle.

6. The method of claim 4, wherein each of the leads has first and second generally oppositely facing surfaces, all of the first surfaces facing generally in a first direction and all of the second surfaces facing generally in a second direction that is generally opposite the first direction, the electrical connection of the first integrated circuit die to the first lead portions including a first plurality of electrically conductive wires, each wire of the first plurality having one end bonded to the first surface of one of the leads and having another end bonded to the first integrated circuit die, the electrical connection of the second integrated circuit die to the second lead portions including a second plurality of electrically conductive wires, each wire of the second plurality having one end bonded to the first surface of one of the leads and having another end bonded to the second integrated circuit die.

7. The method of claim 1, wherein the second integrated circuit die has an active circuit area which faces away from the second side of the die paddle and wherein each of the second lead portions has a region that is coplanar with at least part of the second integrated circuit die.

8. The method of claim 4, wherein the second integrated circuit die has an active circuit area which faces away from the second side of the die paddle, and further comprising bonding one end of one of a plurality of electrically conductive wires to one of the leads and bonding the other end of the one of a plurality of electrically conductive wires to the second integrated circuit die.

9. The method of claim 4, further comprising:
mounting a third integrated circuit die over an active circuit area of the second integrated circuit die; and electrically connecting contacts on the third integrated circuit die to the second lead portions.

10. The method of claim 4, wherein the die paddle is a split die paddle.

11. The method of claim 4, further comprising mounting a third integrated circuit die on a spacer that is mounted on the second integrated circuit die and is interposed between the second integrated circuit die and the third integrated circuit die.

12. The method of claim 11, wherein each of the second lead portions has a region that is coplanar with at least part of the second integrated circuit die, and wherein each of the leads has a third portion that extends between the first and second lead portions.

13. The method of claim 4, further comprising
providing a first plurality of electrically conductive wires, each wire of the first plurality having one end bonded to a first surface of one of the first lead portions and having another end bonded to the first integrated circuit die; and providing a second plurality of electrically conductive wires, each wire of the second plurality having one end bonded to a first surface of one of the second lead portions and having another end bonded to the second die.

14. The method of claim 13, wherein the leads have a region that is coplanar with at least part of the die paddle.

15. The method of claim 13, wherein the die paddle is a split die paddle.

16. The method of claim 13, further comprising providing a third integrated circuit die mounted on a spacer that is mounted on the second integrated circuit die and is interposed between the second integrated circuit die and the third integrated circuit die.

17. The method of claim 16, wherein each of the leads has a third portion that extends between the first and second lead portions, and wherein the first lead portions are disposed closer to a periphery of the first and second integrated circuit die than the second lead portions.

18. A method of mounting integrated circuit die, comprising:
attaching a first side of a die paddle on a lead frame to a central region on a backside of a first integrated circuit die;

attaching a second side of the die paddle opposite the first side to a central region on an active circuit area side of a second integrated circuit die;

electrically connecting a contact on the first integrated circuit die to a first portion of a lead on the lead frame, wherein the first lead portion is disposed a first distance from a periphery of the first integrated circuit die;

electrically connecting a contact on the second integrated circuit die to a second portion of the lead, wherein the second lead portion is disposed a second distance from a periphery of the second integrated circuit die that is different from the first distance;

performing a first plasma cleaning process on the second integrated circuit die after the second side of the die paddle is attached to the central region on the active circuit area side of the second integrated circuit die but before the first side of the die paddle is attached to the backside of the first integrated circuit die; and performing a second plasma cleaning process on the first integrated circuit die after the first side of the die paddle is attached to the backside of the first integrated circuit die but before electrically connecting the contact on the first integrated circuit die to the first lead portion.

19. The method of claim 18, wherein the periphery of the first integrated circuit die and the periphery of the second integrated circuit die are substantially aligned, and wherein the first distance is greater than the second distance.

20. A method of mounting integrated circuit die, comprising:

attaching a first side of a die paddle on a lead frame to a central region on a backside of a first integrated circuit die;

attaching a second side of the die paddle opposite the first side to a central region on an active circuit area side of a second integrated circuit die;

electrically connecting each of a plurality of contacts on the first integrated circuit die to a first portion of one of a plurality of leads on the lead frame, wherein the first lead portions are disposed above a plane between the die paddle and the first integrated circuit die;

electrically connecting each of a plurality of contacts on the second integrated circuit die to a second portion of one of the leads, wherein the second lead portions are disposed below the plane between the die paddle and the first integrated circuit die and closer to a periphery of the first and second integrated circuit die than the first lead portions;

performing a first plasma cleaning process on the second integrated circuit die before the first side of the die paddle is attached to the central region on the backside of the first integrated circuit die but after the second side of the die paddle is attached to the central region on the active circuit area side of the second integrated circuit die; and performing a second plasma cleaning process on the first integrated circuit die after the first side of the die paddle is attached to the central region on the backside of the first integrated circuit die but before electrically connecting each of the contacts on the first integrated circuit die to the first lead portions.

\* \* \* \* \*